(12) United States Patent
Yoshimochi

(10) Patent No.: US 7,535,075 B2
(45) Date of Patent: May 19, 2009

(54) SEMICONDUCTOR DEVICE

(75) Inventor: Kenichi Yoshimochi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 11/883,768

(22) PCT Filed: Apr. 10, 2006

(86) PCT No.: PCT/JP2006/307564

§ 371 (c)(1),
(2), (4) Date: Aug. 6, 2007

(87) PCT Pub. No.: WO2006/112291

PCT Pub. Date: Oct. 26, 2006

(65) Prior Publication Data

US 2008/0135969 A1   Jun. 12, 2008

(30) Foreign Application Priority Data

Apr. 14, 2005 (JP) ............................. 2005-117180

(51) Int. Cl.
*H01L 29/47* (2006.01)
(52) U.S. Cl. ...................... 257/476; 257/471
(58) Field of Classification Search .................. 257/471, 257/476
See application file for complete search history.

(56) References Cited

U.S. PATENT DOCUMENTS 4,587,547 A   5/1986  Amemiya et al.
4,641,174 A   2/1987  Baliga
6,307,244 B1  10/2001 Shikata et al.
6,426,541 B2 * 7/2002  Chang et al. ................. 257/472
2002/0190340 A1  12/2002 Moriguchi et al.

FOREIGN PATENT DOCUMENTS

| JP | 56-37683 | 4/1981 |
| JP | 59-143370 | 8/1984 |
| JP | 64-54761 | 3/1989 |
| JP | 3-70907 | 11/1991 |
| JP | 7-254718 | 10/1995 |
| JP | 2000-058873 | 2/2000 |
| JP | 2002-050773 | 2/2002 |
| JP | 2002-314099 | 10/2002 |
| JP | 2002-373989 | 12/2002 |
| JP | 2005-167149 | 6/2005 |

* cited by examiner

*Primary Examiner*—Douglas M Menz
(74) *Attorney, Agent, or Firm*—Rabin & Berdo, P.C.

(57) ABSTRACT

The semiconductor device includes a first conductive type semiconductor substrate; a Schottky electrode forming a Schottky interface between a surface of the semiconductor substrate and itself; a leakage suppression structure, formed in a surface region of the semiconductor substrate, for suppressing a leakage current by generating a depletion layer when a reverse bias voltage is applied between the Schottky electrode and the semiconductor substrate; and a highly doped layer formed in the surface region of the semiconductor substrate in a region between the surface and the leakage suppression structure, the highly doped layer being the first conductive type, exhibiting a higher impurity concentration than the semiconductor substrate, and forming the Schottky interface between the Schottky electrode and itself.

4 Claims, 1 Drawing Sheet

SEMICONDUCTOR DEVICE

TECHNICAL FIELD

The present invention relates to a semiconductor device comprising a Schottky electrode that Schottky-contacts with a semiconductor substrate.

RELATED ART

A Schottky barrier diode includes a semiconductor substrate and a Schottky electrode that has a Schottky junction with the surface of the semiconductor substrate. Schottky barrier diodes have major problems to be solved: to reduce forward voltage ($V_F$) that is necessary to induce forward current between the Schottky electrode and the semiconductor substrate; and to reduce a reverse leakage current ($I_R$) that leaks upon application of reverse bias voltage between the Schottky electrode and the semiconductor substrate. Because there is a trade-off relationship between the forward voltage $V_F$ and the reverse leakage current $I_R$, it is difficult to satisfy the requirement at the same time.

For example, Patent Document 1 discloses a Schottky barrier diode having a P-type diffusion region formed on the surface of an N-type semiconductor substrate. With this structure, upon application of the reverse bias voltage, depletion layers that spread from the P-type diffusion region narrow the reverse leakage current path. Patent Document 2 discloses a Schottky barrier diode having a trench formed on the surface of the N-type semiconductor substrate. The trench is embedded with a gate electrode connecting to a Schottky electrode to form a trench gate structure. From the trench gate structure, the depletion layers spread and suppress the reverse leakage current upon application of reverse bias voltage.

Patent Document 1: Japanese Unexamined Patent Publication No. 2000-58873

Patent Document 2: Japanese Unexamined Patent Publication No. 2002-50773

SUMMARY OF THE INVENTION

Problems to be Solved

In the both cases, however, the P-type diffusion region or the trench gate structure narrows the forward current path, resulting in a higher on-resistance and higher forward voltage ($V_F$).

The object of the present invention is, therefore, to provide a semiconductor device that is capable to reduce the reverse leakage current and forward voltage at the same time.

Solution to the Problems

The semiconductor device of the present invention comprises: a first conductive type semiconductor substrate; a Schottky electrode forming a Schottky interface between a surface of the semiconductor substrate and itself; a leakage suppression structure, formed in a surface region of the semiconductor substrate, for suppressing a leakage current by generating a depletion layer when a reverse bias voltage is applied between the Schottky electrode and the semiconductor substrate; and a highly doped layer formed in the surface region of the semiconductor substrate in a region between the surface and the leakage suppression structure, the highly doped layer being the first conductive type, exhibiting a higher impurity concentration than the semiconductor substrate, and forming the Schottky interface between the Schottky electrode and itself.

With this configuration, the leakage suppression structure can suppress or prevent the flow of reverse leakage current, and further, the highly doped layer can reduce the resistance in the forward current path, thereby reducing the on-resistance and the forward voltage ($V_F$) that induces the forward current. Accordingly, the mutually contradictory requests on a Schottky barrier device can be satisfied at the same time.

It is preferable that the leakage suppression structure is formed across a region from a surface of the semiconductor substrate to a portion that is deeper than the highly doped layer, and includes an impurity diffusion layer of a second conductive type that is different from the first conductive type. With this configuration, when the reverse bias voltage is applied, the depletion layer that spreads from the impurity diffusion layer can without fail narrow or block the current path that flows across the highly impurity diffusion layer, thereby effectively achieving the reduction of the on-resistance through the highly impurity diffusion layer and the suppression of the reverse leakage current through the leakage suppression structure at the same time.

The leakage suppression structure may be formed across a region from a surface of the semiconductor substrate to a portion that is deeper than the highly doped layer, and includes a trench gate structure which is embedded with a gate electrode that is electrically connected to the Schottky electrode. With this configuration, when the reverse bias voltage is applied, the depletion layer that spreads from the trench gate structure can without fail narrow or block the current path that flows across the highly doped layer, thereby effectively achieving the reduction of the on-resistance through the highly doped layer and the suppression of the reverse leakage current through the leakage suppression structure at the same time.

Furthermore, it is preferable that the leakage suppression structure is designed to form a depletion layer that narrows or blocks the path of the leakage current flowing through the Schottky electrode and the semiconductor substrate, upon application of reverse bias voltage between the Schottky electrode and the semiconductor substrate. This configuration allows the reduction of the reverse leakage current without fail.

Aforementioned or further objects, features and advantages of the present invention will become apparent from the following detailed description, taken in combination with the appended drawings.

DESCRIPTION OF REFERENCE NUMERALS

1 . . . N-type semiconductor substrate, 2 . . . P-type diffusion layer, 3 . . . Schottky electrode, 5 . . . $N^+$-type highly doped layer, 6 . . . outer peripheral P-type diffusion layer, 8 . . . current path, 10 . . . depletion layer, 12 . . . trench gate structure, 15 ... trench, 16 ... insulating layer, 17 ... gate electrode, 20 ... depletion layer

BEST MODE FOR CARRYING OUT THE INVENTION

Figure 1:
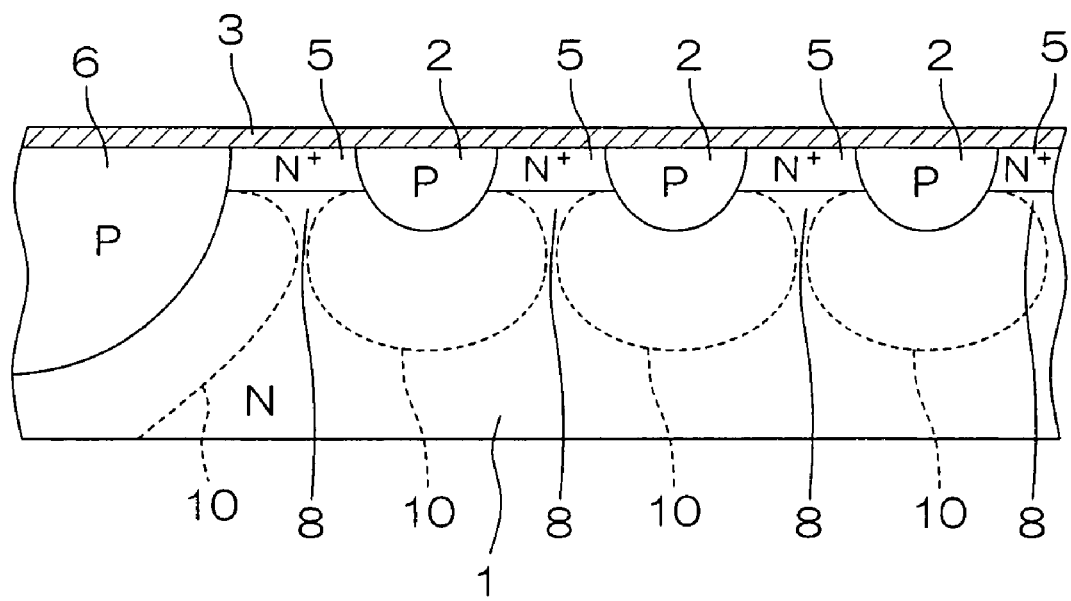
FIG. 1 shows a schematic cross-sectional view illustrating a configuration of Schottky diode which is a semiconductor device according to a first embodiment of the present invention.

FIG. 1 shows a schematic cross-sectional view illustrating a configuration of a semiconductor device according to a first embodiment of the present invention. The semiconductor device having a Schottky barrier diode comprises a semiconductor substrate 1 including a N-type silicon substrate; a P-type diffusion layer 2 (impurity diffusion layer) formed spaced apart in the surface region of the semiconductor substrate 1; and a Schottky electrode 3 formed on the surface of the semiconductor substrate 1. The P-type diffusion layer 2 is exposed on the surface of the semiconductor substrate 1 and electrically connected to the Schottky electrode 3. The impurity concentration of the P-type diffusion layer 2 is $1.0 \times 10^{15}$ to $1.0 \times 10^{19}$ atoms/cm$^3$, for example. FIG. 1 shows the P-type diffusion layer 2 that includes a plurality of diffusion layers formed in parallel with each other to make a striped pattern. Alternatively, the diffusion layer 2 may include a plurality of diffusion layers that are spaced apart with each other to make, for example, a dotted pattern on the principal surface of the semiconductor substrate 1 as viewed from above.

In the surface region of the semiconductor substrate 1 in a region contacting the P-type diffusion layer 2, a N$^+$ type highly doped layer 5 is formed in such a way that an N-type impurity having the same conductive type as the semiconductor substrate 1 is doped with a higher impurity concentration than the semiconductor substrate 1. The N$^+$ type highly doped layer 5 is formed on a region shallower than the depth of P-type diffusion layer 2. The impurity concentration level of the N$^+$ type highly doped layer 5 is determined ($1.0 \times 10^{15}$ to $1.0 \times 10^{18}$ atoms/cm$^3$, for example) so as to be capable to form a Schottky interface between the Schottky electrode 3 and the N$^+$ type highly doped layer 5. For example, the junction depth of the P-type diffusion layer 2 is 0.1 to 3.0 μm, and that of the N$^+$ type highly doped layer 5 is 0.1 to 2.0 μm.

The N$^+$ type highly doped layer 5 may be formed by diffusing the impurity or by growing a highly doped epitaxial layer on the semiconductor substrate. More specifically, the N-type semiconductor substrate is formed with a low doped N-type epitaxial layer. On the low doped N-type epitaxial layer, a N$^+$ type epitaxial layer (N$^+$ type highly doped layer 5) may be grown as thin as 0.1 to 3.0 μm, for example. The N$^+$ type epitaxial layer has a higher N-type impurity concentration ($1.0 \times 10^{15}$ to $1.0 \times 10^{18}$ atoms/cm$^3$, for example) than the low doped N-type epitaxial layer. The P-type diffusion layer 2 may then be formed by diffusing impurity.

In the peripheral region of the semiconductor substrate 1, an outer peripheral P-type diffusion layer 6 with an impurity concentration of, for example, $1.0 \times 10^{16}$ to $1.0 \times 10^{19}$ atoms/cm$^3$ is formed in order to increase the breakdown voltage. Also between the outer peripheral P-type diffusion layer 6 and the inner P-type diffusion layers 2, the N$^+$ type highly doped layers 5 are formed. The outer peripheral P-type diffusion layer 6 is formed by diffusing a P-type impurity across a region that is wider than the P-type diffusion layer 2 and deeper (a junction depth of 0.5 to 5.0 micrometers, for example) than the P-type diffusion layer 2 in the semiconductor substrate 1.

In this configuration of the Schottky barrier diode, when a predetermined amount of forward voltage $V_F$ is applied between the Schottky electrode 3 as an anode and the semiconductor substrate 1 as a cathode, the forward current is induced through a current path 8 that exists between the P-type diffusion layers 2. At this moment, the N$^+$ type highly doped layer 5 contributes to the reduction of the on-resistance, and to the reduction of the forward voltage $V_F$ at the same time. The forward voltage $V_F$ depends upon the Schottky barrier $\phi_B$ between the Schottky electrode 3 and N$^+$ type highly doped layer 5; and also upon the electrical resistance and forward current $I_F$ of the current path 8 in the semiconductor substrate 1. The N$^+$ type highly doped layer 5 contributes to the reduction of the electrical resistance of the semiconductor substrate 1, and will thus contribute to the reduction of the forward voltage $V_F$.

On the other hand, when the reverse bias voltage is applied between the Schottky electrode 3 and the semiconductor substrate 1, the depletion layer 10 spreads from the P-type diffusion layers 2 and the outer peripheral P-type diffusion layer 6 that are connected to the Schottky electrode 3. Since the P-type diffusion layer 2 and the outer peripheral P-type diffusion layer 6 reach to a region deeper than the N$^+$ type highly doped layer 5 in the semiconductor substrate 1, the depletion layer 10 that spreads from each of the P-type diffusion layers 2 and 6 can be arranged close to each other in order to narrow, or even arranged closer to each other in order to block the reverse current path in a point deeper than the N$^+$ type highly doped layer 5. In this manner, upon the application of reverse bias voltage, the current path 8 is immediately narrowed or blocked at a point deeper than the N$^+$ type highly doped layer 5, thereby allowing the suppression or prevention of the flow of reverse leakage current.

Figure 2:
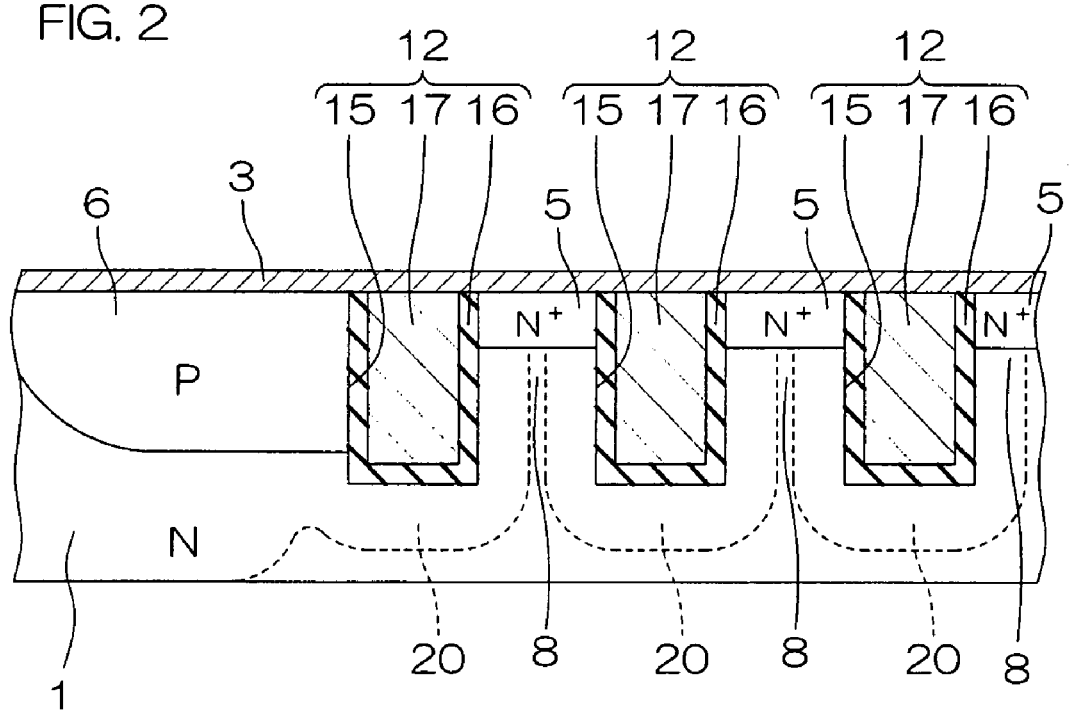
FIG. 2 shows a schematic cross-sectional view illustrating a configuration of Schottky diode which is a semiconductor device according to a second embodiment of the present invention.

FIG. 2 shows a schematic cross-sectional view illustrating a configuration of Schottky barrier diode which is a semiconductor device according to a second embodiment of the present invention. In FIG. 2, elements corresponding to those in above FIG. 1 are designated by the same reference numeral.

In this embodiment, instead of using the P-type diffusion layer 2 in the aforementioned first embodiment, a trench gate structure 12 is used. Further in this embodiment, a plurality of the trench gate structures 12 are provided on the semiconductor substrate 1 so that a striped pattern is made. However, a plurality of the trench gate structures 12 may be formed spaced apart with each other to make, for example, a dotted pattern on the principal surface of the semiconductor substrate 1 as viewed from above.

The trench gate structure 12 comprises: a trench 15 having a predetermined depth (0.5 to 3.0 μm, for example) pierced from the surface of the semiconductor substrate 1, and having a rectangular cross sectional shape in this embodiment; a insulating layer 16 (silicon oxide layer, for example) adhered to the internal wall surface of the trench 15; and, a gate electrode 17 filled in the trench space inside the dielectric layer 16. The gate electrode 17 is made of polysilicon in which impurities are diffused in order to reduce the resistance. This electrode contacts with and electrically connected to the Schottky electrode 3.

In the region between the trench gate structures 12, the aforementioned N$^+$ type highly doped layers 5 are formed on the surface of the semiconductor substrate 1. The trench gate structures 12 are formed at a region deeper than the N$^+$ type highly doped layers 5 in the semiconductor substrate 1.

In the periphery of the semiconductor substrate 1, the outer peripheral P-type diffusion layer 6 is formed in an outer region of the outermost trench gate structure 12.

In this configuration of the Schottky barrier diode, when a predetermined amount of forward voltage $V_F$ is applied between the Schottky electrode 3 as an anode and the semiconductor substrate 1 as a cathode, the forward current is induced through the current path 8 that exists between the trench gate structures 12. At this moment, the N⁺ type highly doped layer 5 contributes to the reduction of the on-resistance, and contributes to the reduction of the forward voltage $V_F$ at the same time. The forward voltage $V_F$ depends upon the Schottky barrier $\phi_B$ between the Schottky electrode 3 and the N⁺ type highly doped layer 5, and also depends upon the electrical resistance and forward current $1_F$ of the semiconductor substrate 1 in the current path 8. The N⁺ type highly doped layer 5 contributes to the reduction of the electrical resistance of the semiconductor substrate 1, and thus contributes to the reduction of the forward voltage $V_F$.

On the other hand, when a reverse bias voltage is applied between the Schottky electrode 3 and the semiconductor substrate 1, the electric field generating from the gate electrodes 17 connected to the Schottky electrode 3 allows the depletion layer 20 to spread from the trench gate structure 12. Since the trench gate structure 12 reaches to a region deeper than the N⁺ type highly doped layer 5 in the semiconductor substrate 1, the depletion layer 20 that spreads from each of the trench gate structures 12 can be arranged close to each other in order to narrow the reverse current path, or even arranged closer to each other in order to block the reverse current path, in a point deeper than the N⁺ type highly doped layer 5. In this manner, upon the application of reverse bias voltage, the current path 8 is immediately narrowed or blocked at a point deeper than the N⁺ type highly doped layer 5, thereby allowing the suppression or prevention of the flow of reverse leakage current.

The present invention has been described in reference to the two embodiments, however, the invention may be implemented with further embodiments. For example, in the aforementioned embodiment, the use of N-type semiconductor substrate 1 has been described. However, in a configuration where the opposite P-type semiconductor substrate is used, the conductive type of each elements may be inversed. The present invention is not limited solely to the aforementioned embodiments that specifically exemplify a Schottky barrier diode. The invention may be applied to the MOSFET that incorporates the Schottky barrier diode.

While the embodiments of the present invention have been described and illustrated above in detail, it is to be understood that they are exemplary of the invention and accordingly the invention is not to be considered to be limited by the foregoing description and is only limited by the spirit or scope of the appended claims.

This application corresponds to Japanese Patent Application No. 2005-117180 filed on Apr. 14, 2005 with the Japanese Patent Office, the entire disclosure of which is incorporated herein by reference.

What is claimed is:

1. A semiconductor device, comprising:
    a first conductive type semiconductor substrate;
    a Schottky electrode forming a Schottky interface between a surface of the semiconductor substrate and the Schottky electrode;
    a leakage suppression structure, formed in a surface region of the semiconductor substrate, for suppressing a leakage current by generating a depletion layer when a reverse bias voltage is applied between the Schottky electrode and the semiconductor substrate; and
    a highly doped layer formed in the surface region of the semiconductor substrate in a region between the surface and the leakage suppression structure, the highly doped layer being of the first conductive type and exhibiting a higher impurity concentration than the semiconductor substrate, and forming the Schottky interface between the Schottky electrode and the highly doped layer.

2. The semiconductor device according to claim 1, wherein the leakage suppression structure is formed across a region from the surface of the semiconductor substrate to a portion that is deeper than the highly doped layer, and includes an impurity diffusion layer of a second conductive type that is different from the first conductive type.

3. The semiconductor device according to claim 1, wherein the leakage suppression structure is formed across a region from the surface of the semiconductor substrate to a portion that is deeper than the highly doped layer, and includes a trench gate structure which is embedded with a gate electrode electrically connected to the Schottky electrode.

4. The semiconductor device according to claim 1, wherein the leakage suppression structure is designed to form a depletion layer to block or narrow a path of a leakage current which flows through the Schottky electrode and the semiconductor substrate, upon application of a reverse bias voltage between the Schottky electrode and the semiconductor substrate.

* * * * *